US008928518B1

(12) United States Patent
Stepanovic

(10) Patent No.: US 8,928,518 B1
(45) Date of Patent: Jan. 6, 2015

(54) CHARGE-REDISTRIBUTION SAR ADC WITH SAMPLE-INDEPENDENT REFERENCE CURRENT

(71) Applicant: Agilent Technologies, Inc., Loveland, CO (US)

(72) Inventor: Dusan Stepanovic, Mountain View, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 14/014,854

(22) Filed: Aug. 30, 2013

(51) Int. Cl.
*H03M 1/12* (2006.01)
*H03M 1/46* (2006.01)

(52) U.S. Cl.
CPC .................................... *H03M 1/466* (2013.01)
USPC .......................................... 341/172; 341/163

(58) Field of Classification Search
CPC ......... H03M 1/38; H03M 1/40; H03M 1/403; H03M 1/46; H03M 1/462; H03M 1/466; H03M 1/468; H03M 1/804
USPC .................................................. 341/163, 172
See application file for complete search history.

(56) References Cited

U.S. PATENT DOCUMENTS

| | | | | |
|---|---|---|---|---|
| 5,471,208 A | * | 11/1995 | Sauer | 341/120 |
| 6,608,580 B2 | * | 8/2003 | Hsueh | 341/155 |
| 7,947,961 B2 | | 5/2011 | Nys | |
| 7,977,979 B2 | | 7/2011 | Cho et al. | |
| 8,525,719 B2 | * | 9/2013 | Schreiner et al. | 341/163 |

FOREIGN PATENT DOCUMENTS

KR 20020014530 A 5/2002

OTHER PUBLICATIONS

Van Elzakker, et al., "A 10-bit Charge-Redistribution ADC Consuming 1.9uW at 1 MS/s", IEEE Journal of Solid-State Circuits, vol. 45, No. 5, May 2010, p. 1007-1015.
Craninckx, et al., "A 65fJ/Conversion-Step 0-to-50MS/s 0-0.7mW 9b Charge-Sharing SAR ADC in 90nm Digital CMOS", ISSC 2007.
Kapusta, et al., "A 14b 80MS/s SAR ADC with 73.6dB SNDR in 65nm CMOS", ISSCC 2013.

* cited by examiner

*Primary Examiner* — Khai M Nguyen

(57) ABSTRACT

A charge redistribution SAR analog-to-digital converter includes a source of a reference voltage, a digital-to-analog converter, and a reset circuit. The digital-to-analog converter includes converter stages that range in significance from most significant to least significant. Each converter stage includes respective capacitors and switches. The switches are controllable to selectively connect the capacitors to the reference voltage or to ground. The capacitors of the converter stages are weighted in capacitance in accordance with significance of the converter stage. The reset circuit is to control the switches to reset the converter stages with a temporal offset between at least two of the converter stages. The temporal offset between the at least two of the converter stages reduces the dependence of the charge drawn from the reference voltage source during each conversion cycle on the sample of an analog input signal converted to a digital value during the conversion cycle.

20 Claims, 4 Drawing Sheets

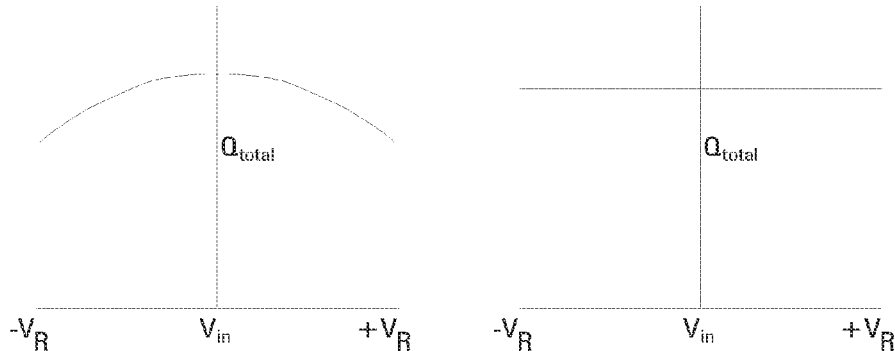

FIG. 1  FIG. 6

```
PROVIDE SOURCE OF REFERENCE VOLTAGE
410

PROVIDE DIGITAL-TO-ANALOG CONVERTER
INCLUDING CONVERTER STAGES RANGING IN SIGNIFICANCE
FROM MOST SIGNIFICANT TO LEAST SIGNIFICANT,
EACH CONVERTER STAGE INCLUDING CAPACITORS AND SWITCHES
420

CONTROL THE SWITCHES DURING A CONVERSION PROCESS
TO SELECTIVELY CONNECT THE CAPACITORS
TO THE REFERENCE VOLTAGE OR TO GROUND
430

CONTROL THE SWITCHES DURING A RESET PROCESS TO
RESET THE CONVERTER STAGES WITH A TEMPORAL OFFSET
BETWEEN AT LEAST TWO OF THE CONVERTER STAGES
440
```

CHARGE-REDISTRIBUTION SAR ADC WITH SAMPLE-INDEPENDENT REFERENCE CURRENT

BACKGROUND

Many applications employ an analog-to-digital converter (ADC) to convert an analog input signal representing a real-world quantity, such as audio, an image, a moving picture, etc., to a digital signal that can be processed digitally. One type of analog-to-digital converter commonly used is known as a charge-redistribution successive approximation register analog-to-digital converter (SAR ADC).

A typical SAR ADC includes a digital-to-analog converter (DAC), a comparator, and a logic circuit. The DAC includes a reference voltage source. The DAC generates an analog signal that depends on the reference voltage provided by the reference voltage source, and an M-bit digital value received from the logic circuit. The DAC has M converter stages plus an additional converter stage. Each of the M converter stages is involved in generating a respective bit of the digital value. The comparator compares a sample of an analog input signal input to the ADC with the analog signal generated by the DAC to generate a comparator output. The ADC repetitively performs conversion cycles in which the ADC digitizes a single sample of the analog input signal to generate a respective digital value. Each conversion cycle includes, in order, a sampling process, a conversion process, and a reset process. In the sampling process, the ADC samples the analog input signal to generate a respective sample. In the conversion process, the ADC generates a respective M-bit digital value that represents the sample of the analog input signal obtained in the sampling process. The DAC begins each conversion cycle in a reset state. During the conversion process, the comparator is strobed M times to produce M comparator outputs. Each time the comparator is strobed, the logic circuit operates in response to the comparator output to set a respective bit of the digital value input to the DAC so that the analog signal output by the DAC in response to the digital value better approximates the sample of the analog input signal. In the reset process at the end of each conversion cycle, the converter stages of the DAC receive a common reset pulse that restores the converter stages to the reset state simultaneously.

The charge drawn from the reference voltage source during each converter cycle is dependent on the sample of the analog input signal. A parameter that depends on the sample of the analog input signal will be described herein as being sample dependent, or having sample dependence. Since the output impedance of the reference voltage source is greater than zero, the reference voltage is also sample dependent. The reference voltage being sample dependent causes undesired harmonic distortion. The problem is particularly serious in high-speed, high-performance ADCs, such as the ADCs used in measurement instrumentation, in which the charge drawn from the reference voltage source is large. Reducing the output impedance of the reference voltage source can ameliorate this problem, but only at the expense of an undesirable increase in power consumption.

Other techniques for reducing the sample dependence of the charge drawn from the reference voltage source are known, but such techniques typically only reduce the sample dependence of the charge drawn from the reference voltage supply during the conversion process. Such conventional techniques typically do not reduce an additional sample dependence, namely, the sample dependence of the charge drawn from the reference voltage source during the reset process. FIG. 1 is a graph showing the variation of the total charge $Q_{total}$ drawn from the reference voltage source of a conventional charge redistribution SAR ADC during each conversion cycle on the sample $V_{in}$ of the analog input signal. The sample-dependent charge drawn through the non-zero output resistance of the reference voltage source undesirably causes the reference voltage used to convert the sample of the analog input signal in the next conversion cycle to depend on the sample of the analog input signal converted in the current conversion cycle.

Accordingly, what is needed is a charge redistribution SAR ADC in which the total charge drawn from the reference voltage source throughout each conversion cycle, including during the reset process, has a reduced dependence on the sample of the analog input signal converted in the conversion cycle.

BRIEF DESCRIPTION OF THE DRAWINGS

FIG. 1 is a graph showing the dependence on the sample of the analog input signal of the total charge drawn from the reference voltage source of a conventional analog-to-digital converter (ADC) during each conversion cycle.

FIG. 6 is a graph showing the dependence on the sample of the analog input signal of the total charge drawn from the reference voltage source of the ADC shown in FIG. 2 during each conversion cycle.

FIG. 7 is a flowchart showing an example of an analog-to-digital conversion method as disclosed herein.

DETAILED DESCRIPTION

Disclosed herein is a charge redistribution SAR analog-to-digital converter that includes a source of a reference voltage, a digital-to-analog converter and a reset circuit. The digital-to-analog converter includes converter stages that range in significance from most significant to least significant. Each converter stage includes respective capacitors and switches. The switches are controllable to selectively connect the capacitors to the reference voltage or to ground. The capacitors of the converter stages are weighted in capacitance in accordance with the significance of the converter stage. The reset circuit is to control the switches to reset the converter stages with a temporal offset between at least two of the converter stages. The temporal offset between the at least two of the converter stages reduces the dependence of the charge drawn from the reference voltage source during each conversion cycle on the sample of an analog input signal that was converted to a digital value during the conversion cycle. Specifically, with the temporal offset, the sample-dependent charge drawn from the reference voltage source during the conversion process of each conversion cycle is at least partially replaced with a sample-dependent charge output from the DAC during the reset process of the conversion cycle to reduce the sample dependence of the total charge drawn from the reference voltage source throughout the conversion cycle.

In an example, the reset circuit resets all of the converter stages sequentially. In another example, the converter stages have a reset time constant, and the temporal offset between the converter stages is greater than 1/10 of the reset time constant. A greater reduction in the sample-dependence of the total charge drawn from the reference voltage source throughout each conversion cycle is obtained with a temporal offset greater than 1/10 of the reset time constant, but since the reset time constant is typically significantly smaller than the conversion time of a single converter stage, the sum of the temporal offsets when all the converter stages are reset sequentially is typically comparable with the conversion time of a single converter stage.

Also disclosed is a charge redistribution SAR analog-to-digital conversion method in which a digital-to-analog converter and a source of a reference voltage are provided. The digital-to-analog converter includes converter stages ranging in significance from most significant to least significant. Each converter stage includes capacitors and switches. The capacitors of the converter stages are weighted in capacitance in accordance with the significance of the converter stage. The switches are controlled to selectively connect the capacitors to the reference voltage or to ground, and the switches are also controlled to reset the converter stages with a temporal offset between at least two of the converter stages.

Figure 2:
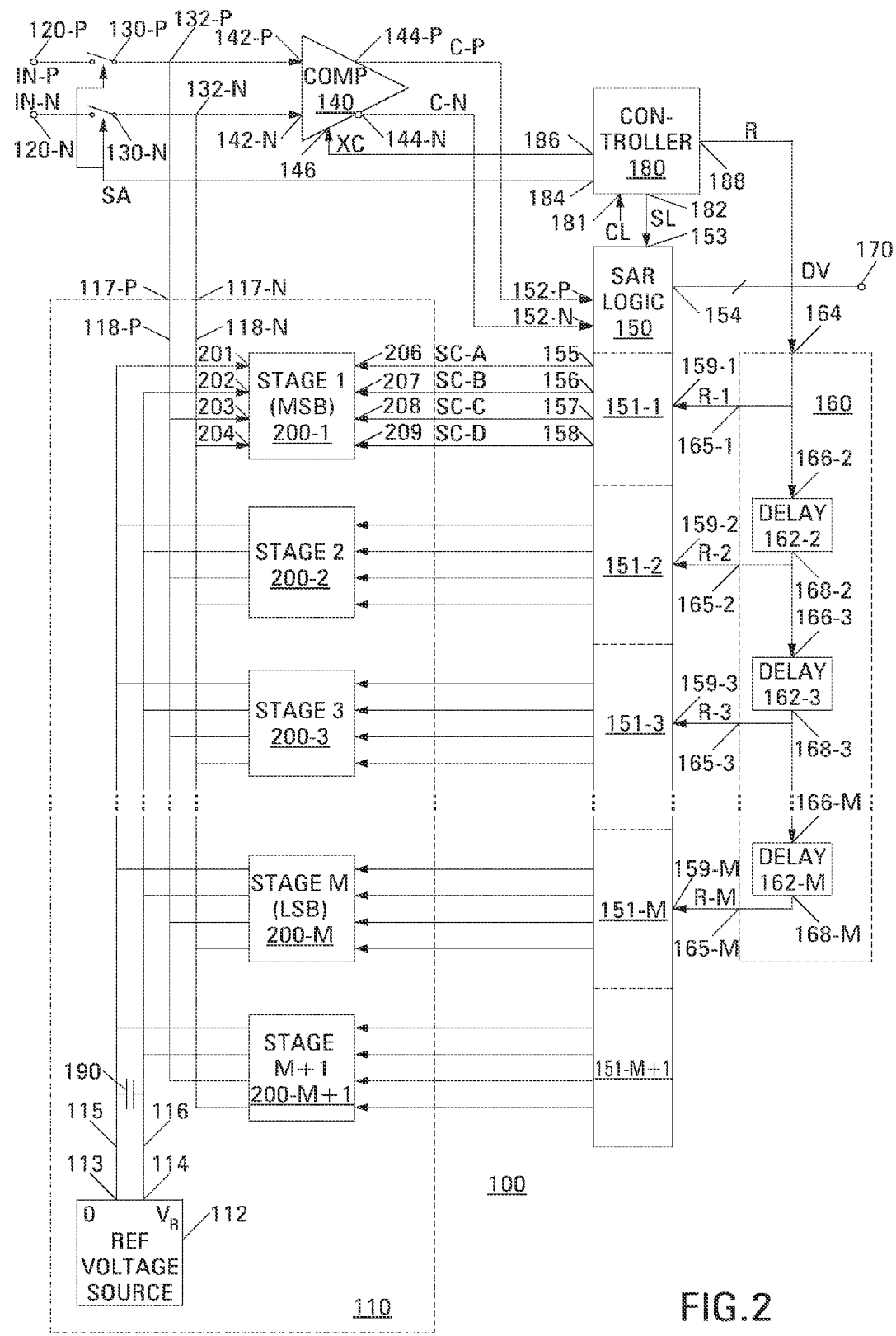
FIG. 2 is a block diagram showing an example of an M-bit charge-redistribution successive approximation register analog-to-digital converter as disclosed herein.

FIG. 2 is a block diagram showing an example 100 of an M-bit charge-redistribution successive approximation register analog-to-digital converter (SAR ADC). ADC 100 includes a digital-to-analog converter (DAC) 110, a differential analog input 120-P, 120-N, sampling switches 130-P, 130-N, a comparator 140, SAR logic 150, a temporal-offset reset circuit 160, a digital output 170, and a controller 180.

Controller 180 includes a clock input 181, an SAR logic control output 182, a sampling switch control output 184, a comparator strobe output 186, and a reset output 188. Controller 180 receives a clock signal CL at clock input 181 and, in response to the clock signal, generates SAR logic control signals SL, a sampling switch control signal SA, a comparator strobe signal XC, and a reset pulse R that together control the operation of ADC 100. In some implementations, controller 180 is part of SAR logic 150.

Differential analog input 120-P, 120-N is provided to receive a differential analog input signal having components IN-P and IN-N. Comparator 140 is a differential comparator and has differential inputs 142-P, 142-N, comparator outputs 144-P, 144-N, and a strobe input 146. Strobe input 146 is connected to receive comparator strobe signal XC from the comparator strobe output 186 of controller 180. Sampling switch 130-P is a controlled single-pole switch connected in series between analog input 120-P and the input 142-P of comparator 140. Sampling switch 130-N is a controlled single-pole switch connected in series between analog input 120-N and the analog input 120-N of comparator 140. Sampling switches 130-P, 130-N are controlled by sampling switch control signal SA received from the sampling switch control output 184 of controller 180.

DAC 110 includes a reference voltage source 112, a ground bus 115, a reference voltage bus 116, differential analog input/output ports 117-P, 117-N, differential analog signal buses 118-P, 118-N, and M+1 converter stages 200-1, 200-2, 200-3 . . . 200-M, 200-M+1. Reference numeral 200-$m$ will be used to refer to the converter stages in general and to the converter stages collectively.

Reference voltage source 112 has a ground output 113 and a reference voltage output 114. A ground bus 115 extends between ground output 113 and a respective ground input of each converter stage 200. A reference voltage bus 116 extends between the reference voltage output 114 of reference voltage source 112 and a respective reference voltage input of each converter stage 200. In some implementations, reference voltage source 112 is external to DAC 110. In such implementations, DAC 110 includes additional inputs (not shown) connected to ground bus 115 and reference voltage bus 116 to which the ground output and the reference voltage output, respectively, of the external reference voltage source connect. In some implementations, the output 113 of reference voltage source 112 described herein as ground output 113 is at a potential different from ground potential and different from reference voltage $V_R$. In such implementations, elements described herein as connected to ground are connected to output 113.

FIG. 2 additionally shows a capacitor 190 connected between ground bus 115 and reference voltage bus 116. Capacitor 190 is shown external of reference voltage source 112 for illustrative purposes only. Typically, capacitor 190 is connected between ground output 113 and reference voltage output 114 inside reference voltage source 112. Capacitor 190 has a capacitance sufficiently large to ensure that reference voltage $V_R$ varies by less than the voltage equivalent of the least significant bit of ADC 100 notwithstanding the charge drawn from the reference voltage source by DAC 110 during the conversion process and the charge returned to the reference voltage source by DAC 110 during the reset process.

Differential analog signal buses 118-P, 118-N extend within DAC 110 between differential analog input/output ports 117-P, 117-N, respectively, and respective analog input/output ports of each converter stage 200. Analog input/output port 117-P is additionally connected to an analog signal node 132-P between sampling switch 130-P and the input 142-P of comparator 140. Analog input/output port 117-N is additionally connected to an analog signal node 132-N between sampling switch 130-N and the input 142-N of comparator 140. At the beginning of the conversion process of each conversion cycle, DAC 110 is preset with a sample of differential analog input signal IN-P, IN-N via analog input/output ports 117-P, 117-N and analog signal buses 118-P, 118-N. Additionally, during the conversion process of each conversion cycle, DAC 110 outputs a differential analog signal to the inputs 142-P, 142-N of comparator 140 via analog input/output ports 117-P, 117-N and analog signal buses 118-P, 118-N.

As will be described in greater detail below with reference to FIG. 3, each converter stage 200-$m$ includes capacitors and switches. SAR logic 150 provides respective switch control signals SC-A, SC-B, SC-C, and SC-D that control the switches within each converter stage to selectively connect the capacitors within the converter stage to reference voltage $V_R$ generated by reference voltage source 112 or to ground.

The respective capacitors of each converter stage 200-$m$ are weighted in capacitance relative to those of the other converter stages in accordance with the significance of the converter stage. In an example, the capacitance of the capacitors are binary weighted, so that the capacitance of each capacitor of most-significant-bit converter stage 200-1 is twice that of each capacitor of next-most-significant-bit converter stage 200-2, and is $2^M$ times that of each capacitor of least-significant-bit converter stage 200-M and of an additional converter stage 200-M+1. In other examples, the weighting of the capacitance of the capacitors is other than binary. The weighting of the capacitance of the capacitors determines the digital-to-analog conversion properties of DAC 110.

The switches in each stage are typically implemented using PMOS and NMOS transistors. Typically, the transistors implementing the switches of each converter stage 200-*m* are scaled in size relative to those of the other converter stages approximately proportionally to the scaling of the capacitance of the capacitors of the converter stages. Consequently, the ON resistances of the switches are scaled approximately inversely to the capacitances of the capacitors. In an example in which the capacitance of the capacitors is binary weighted, the transistors implementing the switches of most-significant-bit converter stage 200-1 are scaled such that their ON resistance is one-half that of the transistors implementing the switches of next-most-significant-bit converter stage 200-2, and is $\frac{1}{2}^M$ times that of the transistors implementing the switches of least-significant-bit converter stage 200-M and additional converter stage 200-M+1. Scaling the transistors implementing the switches of the converter stages such that their ON resistance is scaled approximately inversely to the capacitance of the respective capacitors of the converter stages reduces variation among the converter stages in the charge and discharge time constants of the capacitors through the respective switches.

Most-significant-bit converter stage 200-1 will now be described, initially with reference to FIG. 2. Apart from the capacitances of their capacitors and the ON resistances of the transistors implementing their switches, the remaining converter stages 200-2 through 200-M+1 are identical to converter stage 200-1 in structure and operation, and will not be separately described. Moreover, reference numerals for the inputs and outputs of the remaining converter stages are omitted from FIG. 2 to simplify the drawing.

Converter stage 200-1 includes a ground input 201, a reference voltage input 202, and differential analog signal input/output ports 203, 204. Ground input 201 is connected via ground bus 115 to receive a ground potential from the ground output 113 of reference voltage source 112. Reference voltage input 202 is connected via reference voltage bus 116 to receive reference voltage $V_R$ from the reference voltage output 114 of reference voltage source 112. Analog signal input/output ports 203, 204 are connected via analog signal buses 118-P, 118-N, respectively, to receive analog signals from, and to provide analog signals to, analog signal nodes 132-P, 132-N.

SAR logic 150 includes stage controllers 151-1, 151-2, 151-3 ... 151-M, 151-M+1. Reference numeral 151-*m* will be used to refer to the stage controllers of SAR logic 150 in general and to the stage controllers collectively. Each stage controller 151-*m* controls a respective one of the converter stages 200-*m* of DAC 110. Specifically, each stage controller 151-*m* outputs to the respective converter stage 200-*m* switch control signals SC-A, SC-B, SC-C, SC-D that set the converter stage to a reset state, or, depending on the outputs of comparator 140, to a 0 state or a 1 state. SAR logic 150 additionally includes comparator signal inputs 152-P, 152-M, an SAR logic control input 153, and a digital value output 154. Comparator signal inputs 152-P, 152-M are connected to receive comparator output signals C-P, C-N from the outputs 144-P, 144-N, respectively, of comparator 140. SAR logic control input 153 is connected to receive SAR logic control signals SL from the SAR logic control output 182 of controller 180. Digital value output 154 is connected to output to the digital output 170 of ADC 100 a digital value DV corresponding to each sample of analog input signal IN-P, IN-N received at analog inputs 120-P, 120-N.

Each of the stage controllers 151-*m* of SAR logic 150 controls a respective one of the converter stages 200-*m* of DAC 110. Specifically, each stage controller 151-*m* outputs to the respective converter stage 200-*m* switch control signals SC-A, SC-B, SC-C, SC-D that set the converter stage to a reset state, or, depending on the outputs of comparator 140 received at comparator signal inputs 152-P, 152-M, to a 0 state or a 1 state. Two of the states of the switch control signals output by each stage controller 151-*m* can be regarded as representing respective states of a respective bit of the digital input of DAC 110.

Each of the stage controllers 151-1 through 151-M of SAR logic 150 includes, for the corresponding converter stage 200-1 through 200-M, respectively, of DAC 110, switch control outputs 155, 156, 157, 158, and a reset input 159. Reference numeral 159-*m* is used to refer to the reset inputs in general and to the reset inputs collectively. FIG. 2 shows the reset inputs 159-1, 159-2, 159-3, and 159-M of stage controllers 151-1, 151-2, 151-3, and 151-M, respectively. Stage controller 151-M+1 includes switch control outputs similar to switch control outputs 155, 156, 157, 158 but lacks a reset input.

The switch control outputs 155, 156, 157, 158 of stage controller 151-1 are connected to provide respective switch control signals SC-A, SC-B, SC-C, SC-D to the switch control inputs 206, 207, 208, 209 respectively, of converter stage 200-1 of DAC 110. The switch control outputs of the remaining stage controllers 151-*m* of SAR logic 150 are connected to provide respective switch control signals to the switch control inputs of the corresponding converter stages 200-*m* of DAC 110.

Each of stage controllers 151-1 through 151-M of SAR logic 150 operates in response to control signals received from controller 180 at SAR logic control input 153, comparator output signals C-P, C-N output by comparator 140 and received at comparator signal inputs 152-P, 152-N, and a respective reset pulse R-*m* received at reset input 159-*m* to generate switch control signals SC-A, SC-B, SC-C, SC-D, that control the operation of the corresponding converter stage 200-*m* of DAC 110. Stage controller 151-M+1 generates switch control signals SC-A, SC-B, SC-C, SC-D states that hold converter stage 200-M+1 permanently in a reset state. In other implementations, SAR logic 150 lacks a stage controller 151-M+1, and may also lack a stage controller 151-M. In implementations lacking stage controller 151-M+1 or lacking stage controllers 151-M, 151-M+1, converter stage 200-M+1 or converter stages 200-M, 200-M+1 are hardwired, or are otherwise held permanently, in a reset state, or are omitted.

Temporal-offset reset circuit 160 includes at least one delay element 162 that introduces a temporal offset between at least two of the reset pulses R-*m* output to SAR logic 150 by reset circuit 160. Reference numeral 162-*m* is used to refer to the delay elements in general or to the delay elements collectively. Signal designator R-*m* is used to refer to the reset pulses in general or to the reset pulses collectively. The example shown in FIG. 2 includes M-1 delay elements 162-2, 162-3 ... 162-M that provide temporal offsets among all of the reset pulses R-*m* output by reset circuit 160.

Temporal-offset reset circuit 160 includes a reset input 164 and M reset outputs 165-1, 165-2 ... 165-M. Reference numeral 165-*m* is used to refer to the reset outputs in general or to the reset outputs collectively. Reset circuit 160 has no M-th delay element and no M+1-th reset output because stage controller 151-M+1 of SAR logic 150 holds converter stage 200-M+1 of DAC 110 permanently in a reset state, and therefore does not need to be reset. Reset input 164 is connected to receive a reset pulse R at the end of each conversion cycle from the reset output 188 of controller 180. Within reset circuit 160, reset input 164 is connected directly to reset output 165-1 that is connected to provide an undelayed reset pulse R-1 to the reset input 159-1 of stage controller 151-1 of SAR logic 150.

Delay element 162-2 has an input 166-2 and an output 168-2. Input 166-2 is connected to receive the undelayed reset pulse R from reset input 164. Reference numerals 166-m and 168-m are used to refer to the inputs and outputs, respectively, of delay elements 162-m in general or to the inputs and outputs, respectively, collectively. Output 168-2 is connected to provide a reset pulse R-2 to reset output 165-2 that is connected to the reset input 159-2 of stage controller 151-2 of SAR logic 150. Reset pulse R-2 is temporally offset from undelayed reset pulse R-1. Output 168-2 is additionally connected to the input 166-3 of delay element 162-3. Respective delay elements 162-m between adjacent reset outputs 165-m-1, 165-m provide temporal offsets between adjacent reset pulses R-m-1, R-m.

Most-significant-bit converter stage 200-1 will now be described in greater detail with reference to FIG. 3. FIG. 3 is a schematic diagram showing an example of the most-significant-bit converter stage 200-1. As noted above, the remaining converter stages 200-2 through 200-M+1 are structurally identical to converter stage 200-1 apart from the capacitances of their capacitors and the ON resistances of the transistors implementing their switches, and will therefore not be described separately in greater detail.

Also as noted above, converter stage 200-1 includes ground input 201, reference voltage input 202, differential analog signal input/output ports 203, 204, and switch control inputs 206-209. Converter stage 200-1 additionally includes capacitors 220, 222, 224, 226 and switches 230, 232, 234, 236. Each switch is a single-pole, double-throw controlled switch. Switch 230 has a first terminal 240, a second terminal 242, a common terminal 244 and a control input 246. Switches 232, 234, 236 are similar in structure and will not be described. Moreover, reference numerals identifying the parts of the switches 232, 234, 236 are omitted to simplify the drawing.

The first terminal of each switch (e.g., first terminal 240 of switch 230) is connected to ground input 201 and the second terminal of each switch (e.g., second terminal 242 of switch 230) is connected to reference voltage input 202. Capacitor 220 is connected between the common terminal 244 of switch 230 and analog signal input/output port 203. Capacitor 222 is connected between the common terminal of switch 232 and analog signal input/output port 203. Capacitor 224 is connected between the common terminal of switch 234 and analog signal input/output port 204. Capacitor 226 is connected between the common terminal of switch 236 and analog signal input/output port 204.

The control input 246 of switch 230 is connected to receive switch control signal SC-A from switch control input 206. The control input of switch 232 is connected to receive switch control signal SC-B from switch control input 207. The control input of switch 234 is connected to receive switch control signal SC-C from switch control input 208. The control input of switch 236 is connected to receive switch control signal SC-D from switch control input 209. In the example shown, a switch control signal in a high state (indicated by 1 in FIGS. 3, 4A and 4B) on the control input of each switch (e.g., control input 246 of switch 230) causes the switch to connect the common terminal of the switch (e.g. common terminal 244 of switch 230) to the second terminal of the switch (e.g., second terminal 242 of switch 230), and, hence, to reference voltage input 202. A control signal in a low state (indicated by 0 in FIGS. 3, 4A and 4B) on the control input of each switch causes the switch to connect the common terminal of the switch to the first terminal of the switch (e.g., first terminal 240 of switch 230), and, hence, to ground input 201.

Figure 3:
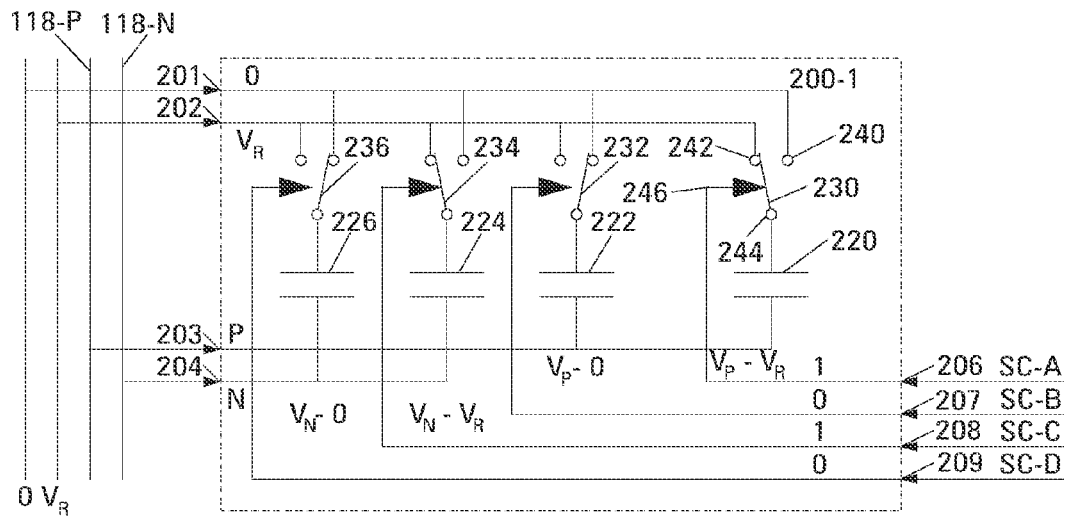
FIG. 3 is a schematic diagram showing an example of a converter stage of the ADC shown in FIG. 2 in its reset state.

FIG. 3 shows converter stage 200-1 in the reset state to which it is set during the reset process at the end of each conversion cycle, and in which it begins each conversion cycle. To set converter stage 200-1 to its reset state, stage controller 151-1 of SAR logic 150 generates switch control signals SC-A and SC-C in a high state, and switch control signals SC-B and SC-D in a low state. These states of switch control signals SC-A, SC-B, SC-C, SC-D respectively cause switch 230 to connect capacitor 220 to reference voltage $V_R$, switch 232 to connect capacitor 222 to ground, switch 234 to connect capacitor 224 to reference voltage $V_R$, and switch 236 to connect capacitor 226 to ground.

Figure 4A:
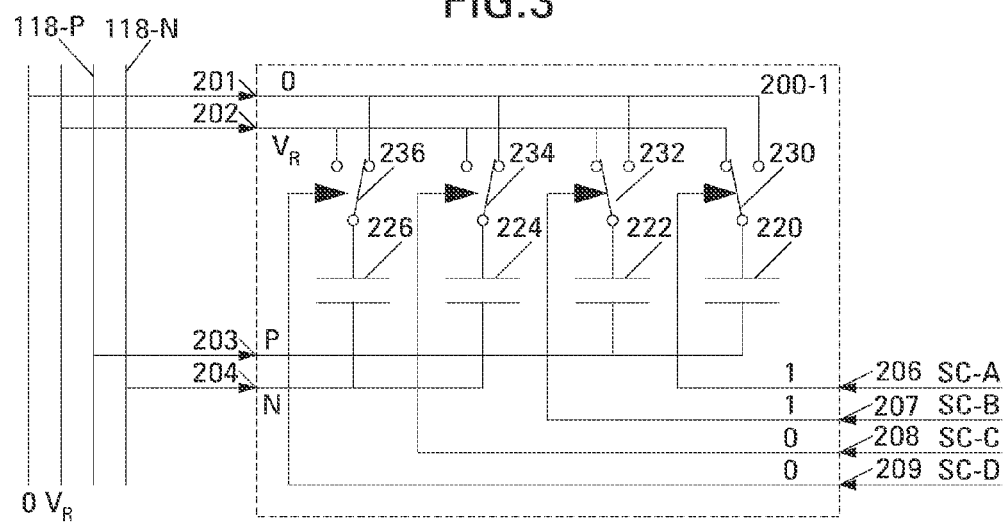
FIG. 4A is a schematic diagram showing the example of the converter stage in its 0 state.

FIG. 4A shows converter stage 200-1 in what will be referred to as its 0 state to which it can be set by stage controller 151-1 of SAR logic 150 during the conversion process of some conversion cycles. The 0 state of converter stage 200-1 corresponds to digital value DV having a most significant bit of 0. To set converter stage 200-1 to its 0 state, stage controller 151-1 of SAR logic 150 changes the states of switch control signals SC-B and SC-C, so that switch control signals SC-A and SC-B are in a high state, and switch control signals SC-C and SC-D are in a low state. These states of switch control signals SC-A, SC-B, SC-C, SC-D cause switches 230 and 232 to connect capacitors 220 and 222, respectively, to reference voltage $V_R$, and switches 234 and 236 to connect capacitors 224 and 226, respectively, to ground.

Figure 4B:
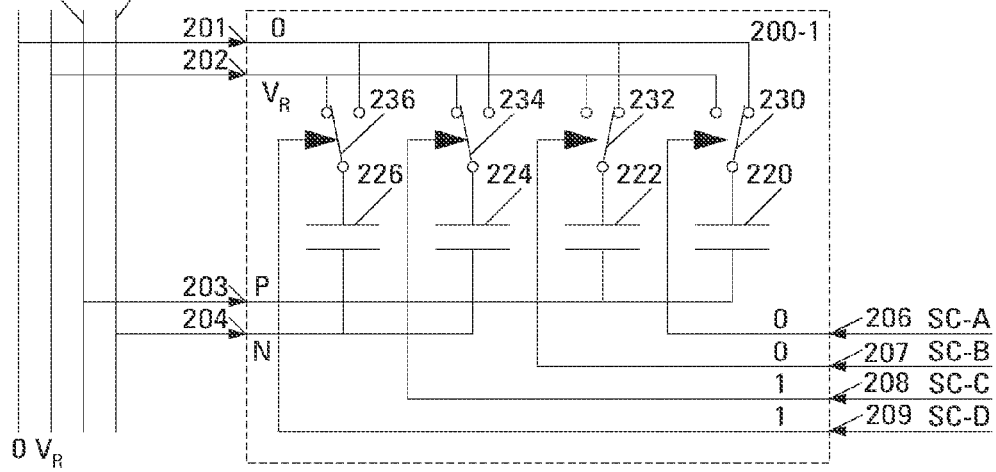
FIG. 4B is a schematic diagram showing the example of the converter stage in its 1 state FIG. 5 includes a block diagram showing an example of the SAR logic of the ADC shown in FIG. 2, and a schematic drawing showing an example of a stage controller that constitutes part of the SAR logic.

FIG. 4B shows converter stage 200-1 in what will be referred to as its 1 state to which it can be set by stage controller 151-1 of SAR logic 150 during the conversion process of other conversion cycles. The 1 state of converter stage 200-1 corresponds to digital value DV having a most significant bit of 1. To set converter stage 200-1 to its 1 state, stage controller 151-1 of SAR logic 150 changes the states of switch control signals SC-A and SC-D, so that switch control signals SC-A and SC-B are in a low state, and switch control signals SC-C and SC-D are in a high state. These states of switch control signals SC-A, SC-B, SC-C, SC-D cause switches 230 and 232 to connect capacitors 220 and 222, respectively, to ground, and switches 234 and 236 to connect capacitors 224 and 226, respectively, to reference voltage $V_R$.

During the conversion process performed by ADC 100 during each conversion cycle, the stage controllers 151-1 through 151-M of SAR logic 150 operate sequentially to provide switch control signals SC-A, SC-B, SC-C, SC-D in the above-described states to converter stages 200-1 through 200-M of DAC 110 to set each of converter stages 200-1 through 200-M to a respective 0 state or 1 state, depending on the relationship between the current sample of analog input signal IN-P, IN-N and reference voltage $V_R$. During the reset process at the end of each conversion cycle, the stage controllers 151-1 through 151-M of SAR logic 150 operate sequentially to provide switch control signals SC-A, SC-B, SC-C, SC-D in the above-described states to converter stages 200-1 through 200-M of DAC 110 to set converter stages 200-1 through 200-M to a reset state, as will be described in greater detail below. Additionally, stage controller 151-M+1 of SAR logic 150 provides control signals SC-A, SC-B, SC-C, SC-D in the states described above with reference to FIG. 3 to converter stage 200-M+1 of DAC 110 to hold converter stage 200-M+1 permanently in the reset state.

Figure 5:
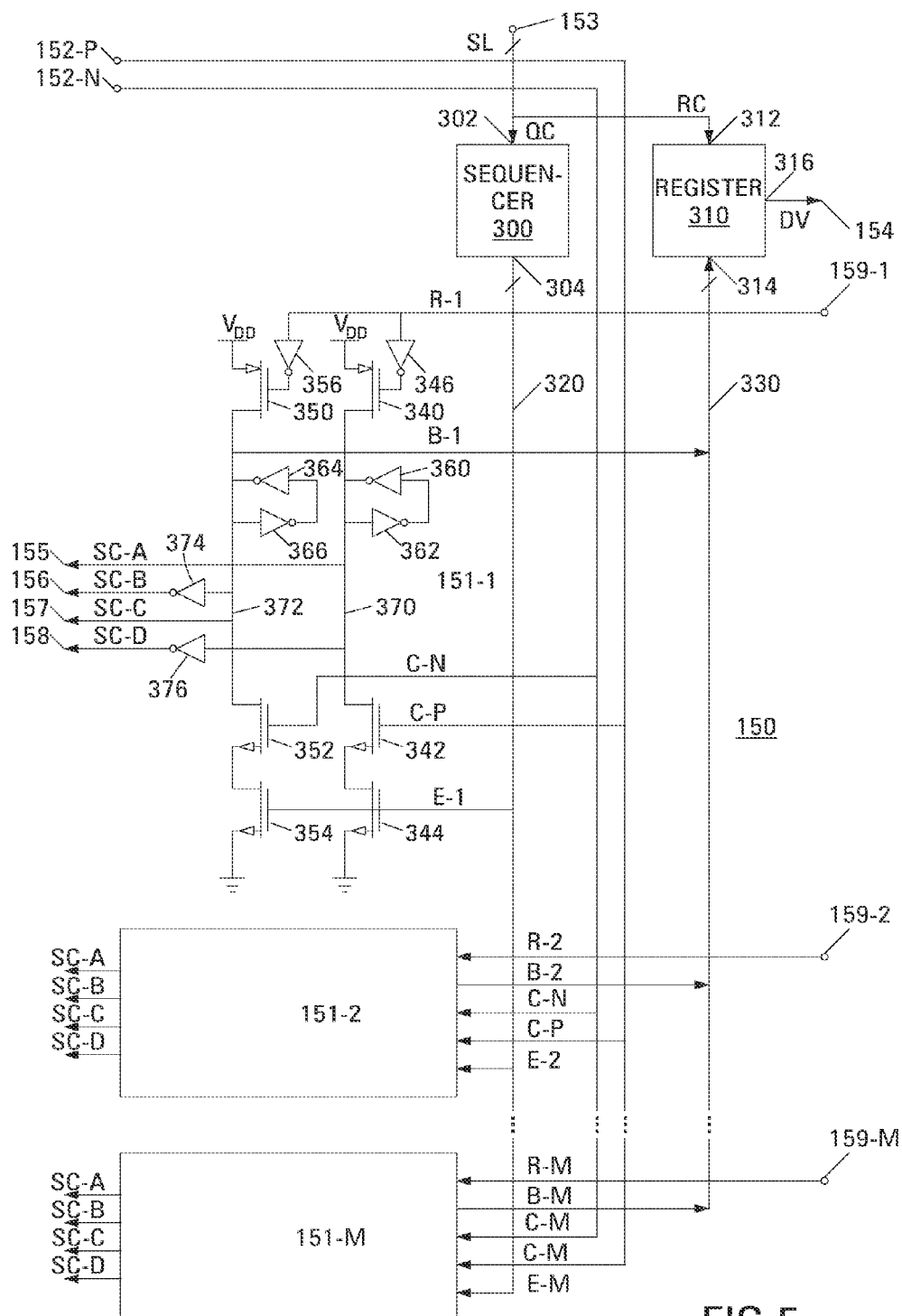

FIG. 5 includes a block diagram showing an example of SAR logic 150 in greater detail. SAR logic 150 includes a sequencer 300, a register 310, an enable bus 320, a bit bus 330, and stage controllers 151-1, 151-2 . . . 151-M. Stage controller 151-M+1 is omitted from the example shown in FIG. 5 as it simply outputs switch control signals SC-A, SC-B, SC-C, SC-D in states that hold converter stage 200-M+1 permanently in the reset state. Sequencer 300 has a sequencer control input 302 connected to receive sequencer control signals QC from SAR logic control input 153. Sequencer 300 additionally has an enable output 304 connected to enable bus 320. In an example, enable bus 320 includes M conductors, each connected to provide a respective enable pulse E-m to a respective one of stage controllers 151-1 through 151-M.

Register 310 includes a register control input 312, a bit input 314, and a digital value output 316. Register control input 312 is connected to receive register control signals RC from SAR logic control input 153. Sequencer control signals QC and register control signals RC collectively constitute at least a subset of SAR logic control signals SL. Bit input 314 is connected to bit bus 330. In an example, bit bus 330 includes M conductors, each connected to receive a respective bit B-m of digital value DV from a respective one of stage controllers 151-1 through 151-M. Digital value output 316 is connected to output digital value DV to the digital value output 154 of SAR logic 150.

SAR logic 150 additionally includes comparator signal inputs 152-P, 152-M and reset inputs 159-1, 159-2, 159-3 . . . 159-M. SAR logic 150 receives comparator output signals C-P, C-N, respectively, from comparator 140 (FIG. 2) at comparator signal inputs 152-P, 152-N, and additionally receives a respective reset pulse R-m for each stage controller 151-1 through 151-M from reset circuit 160 at reset inputs 159-1 through 159-M. Each stage controller 151-m includes switch control outputs 155, 156, 157, 158 at which the stage controller outputs switch control signals SC-A, SC-B, SC-C, SC-D, respectively.

FIG. 5 additionally includes a schematic drawing showing an example of stage controller 151-1 of SAR logic 150. Stage controllers 151-2 through 151-M have the same structure and operation and are therefore not shown in detail. The example of stage controller 151-1 illustrated is highly simplified in that various buffer and driver circuits that good circuit design practice would include in a practical implementation of stage controller 151-1 have been omitted to simplify the drawing and the description thereof. In the example shown, stage controller 151-1 includes a PMOS transistor 340 and two NMOS transistors 342, 344 connected in series, in order, between supply voltage $V_{DD}$ and ground; and a PMOS transistor 350 and two NMOS transistors 352, 354 connected in series, in order, between supply voltage $V_{DD}$ and ground.

The gates of PMOS transistors 340, 350 are connected via inverters 346, 356, respectively, to receive reset pulse R-1 from reset input 159-1. The gate of NMOS transistor 342 is connected to receive comparator output signal C-P from comparator signal input 152-P. The gate of NMOS transistor 352 is connected to receive comparator signal C-N from comparator signal input 152-N. The gates of NMOS transistors 344, 354 are connected to receive the enable pulse E-1 for stage controller 151-1 from sequencer 300 via a respective conductor of enable bus 320.

A latch, composed of inverters 360, 362 connected in series, is connected to a node 370 between the drains of PMOS transistor 340 and NMOS transistor 342. A latch, composed of inverters 364, 366 connected in series, is connected to a node 372 between the drains of PMOS transistor 350 and NMOS transistor 352. Node 370 is additionally connected to output switch control signal SC-A to switch control output 155, and is additionally connected via an inverter 374 to output switch control signal SC-D to switch control output 158. Node 372 is additionally connected via an inverter 376 to output switch control signal SC-B to switch control output 156, and is additionally connected to output switch control signal SC-C to switch control output 157. Finally, node 372 is connected to output bit signal B-1 to register 310 via a respective conductor of bit bus 330.

Referring to FIG. 2, at power on, ADC 100 is initialized by performing a power-on reset in which all the stages 200-m of DAC 110 are reset to the reset state. In an example of the power-on reset, controller 180 outputs a reset pulse R to the reset input 164 of reset circuit 160. In response to reset pulse R, reset circuit 160 generates reset pulses R-1, R-2 . . . R-M that cause SAR logic 150 to reset DAC 110. Reset circuit 160 generates reset pulses R-1, R-2 . . . R-M with a temporal offset between at least two of them. In the example shown, reset circuit 160 generates reset pulses R-1, R-2 . . . R-M sequentially, so that the reset pulse R-m input to the stage controller 151-m that controls each converter stage 200-m of DAC 110 is temporally offset from the reset pulse R-m-1 input to the stage controller 151-m-1 that controls the next-more-significant converter stage 200-m-1 of the DAC.

Referring to FIG. 5, stage controller 151-1 of SAR logic 150 receives a reset pulse R-1 at reset input 159-1. Reset pulse R-1 applied to the gates of PMOS transistors 340, 350 through inverters 346, 356, respectively, turns transistors 340, 350 ON, which pull nodes 370, 372 high. Consequently, stage controller 151-1 outputs switch control signals SC-A, SC-C in a high state, and, due to inverters 374, 376, outputs switch control signals SC-B, SC-D in a low state. Switch control switch control signals SC-A, SC-C in the high state and switch control signals SC-B, SC-D in the low state sets the converter stage 200-1 of DAC 110 to its reset state shown in FIG. 3. The states of nodes 370, 372 and switch control signals SC-A, SC-B, SC-C, SC-D is summarized in Table 1:

TABLE 1

| Node | 370 | | 372 | |
|---|---|---|---|---|
| State | High | | High | |
| Control Signal | SC-A | SC-D | SC-B | SC-C |
| Voltage | High | Low | Low | High |

Referring again to FIG. 2, reset pulses R-2, R-3 . . . R-M sequentially received at reset inputs 159-2, 159-3 . . . 159-M, respectively, cause stage controllers 151-2, 151-3 . . . 151-M, respectively, of SAR logic 150 to generate respective switch control signals SC-A, SC-B, SC-C, SC-D that set the remaining converter stages 200-2, 200-3 . . . 200-M, respectively, of DAC 110 to the reset state in a manner similar to that described above in the description of the operation of stage controller 151-1. Once all the converter stages 200-m have been set to the reset state, the power-on reset ends, and ADC 100 is ready to digitize samples of an analog input signal received at analog inputs 120-P, 120-N. In another example, applicable only to the power-on reset, all of the converter stages 200-m are reset simultaneously.

Once DAC 110 has been reset by the power-on reset, ADC 100 repetitively performs conversion cycles each of which generates a respective digital value by digitizing a respective sample of analog input signal IN-P, IN-N received at analog inputs 120-P, 120-N. At the beginning of each conversion cycle, ADC 100 performs a sampling process in which controller 180 outputs sampling switch control signal SA at sampling switch control output 184. Sampling switch control signal SA causes sampling switches 130-P, 130-N to close momentarily to apply a sample of analog input signal IN-P, IN-N received at analog input 120-P, 120-N to the analog input/output ports 117-P, 117-N of DAC 110. The sample of the analog input signal presets analog signal buses 118-P, 118-N to respective voltage levels $V_P$, $V_N$ corresponding to the sample. Specifically, referring to FIG. 3, while sampling switches 130-P, 130-N are closed, analog input signal IN-P is applied via analog signal bus 118-P to the capacitors 220, 222 of all the converter stages 200-m of DAC 110, and analog input signal IN-N is applied via analog signal bus 118-N to the capacitors 224, 226 of all the stages of the DAC. When sampling switches 130-P, 130-N return to their open state, the voltages across the capacitors 220, 222, 224, 226 of all the converter stages 200-m of DAC 110 after the converter stages have been preset with the sample of the analog input signal during the sampling process are as shown in Table 2:

TABLE 2

| Capacitor | 220 | 272 | 224 | 226 |
|---|---|---|---|---|
| Voltage | $V_R - V_P$ | $V_P$ | $V_R - V_N$ | $V_N$ |

In this, $V_P$ is the average level of analog input signal IN-P while sampling switch 130-P is closed, and $V_N$ is the average level of analog input signal IN-N while sampling switch 130-N is closed. After sampling switches 130-P, 130-N open, the capacitors 220, 222, 224, 226 of all the converter stages 200-m of DAC 110 hold the voltages on analog signal buses 118-P, 118-N at $V_P$ and $V_N$, respectively.

During the conversion process that follows the sampling process, the voltages $V_P$ and $V_N$ on analog signal buses 118-P and 118-N are applied via analog input/output ports 117-P, 117-N to the inputs 142-P, 142-N, respectively, of comparator 140. Controller 180 and SAR logic 150 then operate to cause DAC 110 to generate a voltage that approximates the sample of the analog input signal IN-P, IN-N stored in the capacitors of DAC 110. A voltage that approximates the sample is a voltage opposite in polarity to the sample and as close to equal in level to the sample as the quantization of DAC 110 permits.

Referring now to FIG. 5, at the beginning of the conversion process, controller 180 outputs a sequencer control signal QC at SAR logic control output 182 to the sequencer 300 of SAR logic 150. Sequencer control signal QC causes sequencer 300 to output an enable pulse E-1 on the respective conductor of enable bus 320 connected to stage controller 151-1 that controls the most-significant-bit converter stage 200-1. Enable pulse E-1 momentarily turns on NMOS transistors 344, 354 in stage controller 151-1 of SAR logic 150.

Referring again to FIG. 2, controller 180 next outputs comparator strobe signal XC at comparator strobe output 186. Comparator strobe signal XC strobes comparator 140, which causes the comparator to output comparator output signal C-P or comparator output signal C-N at the respective one of comparator outputs 144-P, 144-N. Which of the comparator output signals C-P, C-N is output by the comparator depends on the polarity of the differential analog signal $V_P$-$V_N$ at the inputs 142-P, 142-N of the comparator. SAR logic 150 receives comparator output signal C-P or comparator output signal C-N at the respective one of its comparator signal inputs 152-P, 152-N and distributes the received comparator output signal to all of the stage controllers 151-1 through 151-M of SAR logic 150.

In an example in which the polarity of the differential analog signal $V_P$-$V_N$ at the inputs 142-P, 142-N of comparator 140 is negative ($V_P$<$V_N$), all stage controllers 151-m of SAR logic 150 receive comparator output signal C-N from comparator 140. Referring again to FIG. 5, since the NMOS transistors 344, 354 of stage controller 151-1 are the only NMOS transistors 344, 354 turned ON by enable pulse E-1, comparator output signal C-N is able to turn ON only NMOS transistor 352 of stage controller 151-1. In its ON state, NMOS transistor 352 pulls the voltage on node 372 low. The latch composed of inverters 364, 366 then holds the voltage on node 372 low when the NMOS transistors 344, 354 of stage controller 151-1 turn off at the end of enable pulse E-1.

With the voltage on node 372 low, stage controller 151-1 outputs switch control signal SC-B in a high state (due to inverter 374), and switch control signal SC-C in a low state. The latch composed of inverters 360, 362 continues to hold the voltage on node 370 high so that stage controller 151-1 continues to output switch control signal SC-A in a high state, and, due to inverter 374, switch control signal SC-D in a low state. Switch control signals SC-A, SC-B in a high state and switch control signals SC-C, SC-D in a low state set converter stage 200-1 of DAC 110 to its 0 state shown in FIG. 4A. The states of nodes 370, 372 and switch control signals SC-A, SC-B, SC-C, SC-D are summarized in Table 3. States that differ from the reset state are shown in bold.

TABLE 3

| Node | 370 | | 372 | |
|---|---|---|---|---|
| State | High | | Low | |
| Control Signal | SC-A | SC-D | SC-B | SC-C |
| State | High | Low | High | Low |

Referring to FIGS. 3 and 4A, the changed state of switch control signal SC-B causes switch 232 to connect capacitor 222 to reference voltage $V_R$ instead of to ground, which increases the voltage $V_P$ on analog signal bus 118-P. The changed state of switch control signal SC-C causes switch 234 to connect capacitor 224 to ground instead of to reference voltage $V_R$, which decreases the voltage $V_N$ on analog signal bus 118-N. The changes in the voltages on analog signal buses 118-P and 118-N decrease the absolute value of $V_P$-$V_N$, the voltage between the analog signal buses. Additionally, changing the states of switches 232 and 234 draws charge from reference voltage source 112 and causes capacitors 222 and 224 to share charge with the remaining capacitors of DAC 110.

Referring again to FIG. 2, alternatively, in an example in which the polarity of the differential analog signal $V_P$-$V_N$ at the input of comparator 140 is positive ($V_P$>$V_N$), all stage controllers 151-m of SAR logic 150 receive comparator output signal C-P from comparator 140. Referring again to FIG. 5, since the NMOS transistors 344, 354 of stage controller 151-1 are the only transistors turned ON by enable pulse E-1, comparator output signal C-P is able to turn ON only NMOS transistor 342 of stage controller 151-1. In its ON state, NMOS transistor 342 pulls the voltage on node 370 low. The latch composed of inverters 360, 362 then holds the voltage on node 370 low when the NMOS transistors 344, 354 of stage controller 151-1 turn off at the end of enable pulse E-1.

With the voltage on node 370 low, stage controller 151-1 outputs switch control signal SC-A in a low state and, due to inverter 376, outputs switch control signal SC-D in a high state. Moreover, the latch composed of inverters 364, 366 continues to hold the voltage on node 372 high so that stage controller 151-1 continues to output switch control signal SC-B in a low state (due to inverter 374) and to output switch control signal SC-C in a high state. Switch control signals SC-A, SC-B in a low state and switch control signals SC-C, SC-D in a high state set converter stage 200-1 of DAC 110 to its 1 state shown in FIG. 4B. The states of nodes 370, 372 and switch control signals SC-A, SC-B, SC-C, SC-D are summarized in Table 4. States that differ from the reset state are shown in bold.

TABLE 4

| Node<br>State<br>Control Signal<br>State | SC-A<br>Low | 370<br>Low<br>SC-D<br>High | SC-B<br>Low | 372<br>High<br>SC-C<br>High |
|---|---|---|---|---|

Referring to FIGS. 3 and 4B, the changed state of switch control signal SC-A causes switch 230 to connect capacitor 220 to ground instead of to reference voltage $V_R$, which decreases the voltage $V_P$ on analog signal bus 118-P. The changed state of switch control signal SC-D causes switch 236 to connect capacitor 226 to reference voltage $V_R$ instead of to ground, which increases the voltage $V_N$ on analog signal bus 118-N. Again, the changes in the voltages on analog signal buses 118-P and 118-N decrease the absolute value of $V_P$-$V_N$, the voltage between the analog signal buses. Additionally, changing the states of switches 230 and 236 draws charge from reference voltage source 112 and causes capacitors 220 and 226 to share charge with the remaining capacitors of DAC 110.

Referring again to FIGS. 2 and 5, after the settling time of stage controller 151-1 has elapsed, controller 180 outputs register control signal RC to register control input 312. Register control signal RC causes register 310 to store bit signal B-1 received at bit input 314 via the respective conductor of bit bus 330 as the most significant bit of digital value DV. In another example, controller 180 outputs register control signal RC after all M bits of digital value DV have been determined. Register control signal RC causes register 310 to store bit signals B-1 through B-M received at bit input 314 via a respective conductors of bit bus 330 simultaneously as digital value DV.

After SAR logic 150 and DAC 110 have generated the most-significant bit of digital value DV, the conversion process continues with controller 180, SAR logic 150 and DAC 110 performing operations similar to those just described to generate and store in register 310 the next-most-significant bit of the digital value DV. During these operations, sequencer 300 generates enable pulse E-2 to enable stage controller 151-2 of SAR logic 150 to generate, in response to comparator output signal C-P or C-N received from comparator 140, the next-most-significant bit signal B-2 and switch control signals SC-A, SC-B, SC-C, SC-D for the next-most-significant bit converter stage 200-2 of DAC 110. Switch control signals SC-A, SC-B, SC-C, SC-D generated by stage controller 151-2 change the connections of the capacitors 222, 224, 226, 228 of converter stage 200-2 of DAC 110 to ground and reference voltage $V_R$ in a way that reduces the absolute value of $V_P$-$V_N$, the voltage between analog signal buses 118-P, 118-N.

Controller 180, SAR logic 150 and DAC 110 then repetitively perform operations similar to those just described to complete the conversion process. In this, stage controllers 151-3 through 151-M of SAR logic 150 are sequentially enabled, in order of decreasing significance, to generate the remaining bits of digital value DV, and to store corresponding bit signals B-m in register 310. In implementations that lack converter stage 200-M and stage controller 151-M, the M-th bit of digital value DV is determined from the state of comparator output signals C-P, C-N after comparator 140 has been strobed for the M-th time during the conversion process. Controller 180 then outputs register control signal RC at SAR logic control output 182 to register control input 312. Register control signal RC causes register 310 to output digital value DV to the digital value output 170 of ADC 100.

Once ADC 100 has completed the conversion process in which it generates all of the bits of digital value DV, the ADC completes the conversion cycle by performing the reset process to return all the conversion stages of DAC 110 to the reset state. In the reset process, controller 180 outputs reset pulse R to the reset input 164 of reset circuit 160. In response to reset pulse R, reset circuit 160 generates reset pulses R-1, R-2 . . . R-M that cause SAR logic 150 to reset DAC 110. Reset circuit 160 generates reset pulses R-1, R-2 . . . R-M with a temporal offset between at least two of them. In the example shown, reset circuit 160 generates reset pulses R-1, R-2 . . . R-M sequentially, so that the reset pulse R-m input to the stage controller 151-$m$ that controls each conversion stage 200-$m$ of DAC 110 is temporally offset from the reset pulse R-m-1 input to the stage controller 151-$m$-1 that controls the next-more-significant conversion stage 200-$m$-1 of the DAC. The reset pulses R-m reset DAC 110 with a temporal offset between each converter stage 200-$m$ and the respective next-more-significant converter stage 200-$m$-1. Stage controllers 151-$m$ and converter stages 200-$m$ respond to reset pulses R-m in the manner described above.

The temporal offset between at least two of the reset pulses R-m reset DAC 110 with a temporal offset between at least two of the converter stages 200-$m$. The temporal offset between the at least two converter stages substantially reduces the dependence of the charge drawn from reference voltage source 112 during the conversion cycle on the sample of the analog input signal IN-P, IN-N digitized in the conversion cycle. In the example shown, reset circuit 160 is configured to reset the converter stages 200-$m$ of DAC 110 sequentially, starting with most-significant-bit converter stage 200-1, and ending with at least-significant-bit converter stage 200-M. Resetting converter stages 200-$m$ sequentially gives the largest reduction in the sample dependence of the charge drawn from the reference voltage source during the conversion cycle.

FIG. 6 is a graph showing the variation of the total charge $Q_{total}$ drawn from reference voltage source 112 of ADC 100 during each conversion cycle on the sample $V_{in}$ of the analog input signal digitized during the conversion cycle. The total charge $Q_{total}$ drawn through the non-zero output resistance of the reference voltage source during the conversion cycle is substantially independent of the sample. Hence, reference voltage $V_R$ is substantially independent of the sample.

During the conversion process, the converter stages of DAC 110 are sequentially enabled, and, while each converter stage is enabled, two of the capacitors of the converter stage are switched from ground to reference voltage $V_R$ or from reference voltage $V_R$ to ground to change the state of the converter stage from the reset state to the 0 state or to the 1 state. While the capacitors of the enabled converter stage are switched, the switching states of the capacitors of the remaining (non-enabled) converter stages remain unchanged. Switching the two capacitors of each converter stage draws charge from reference voltage source 112. During the conversion process, the charge (Qr_conversion) drawn from the reference voltage source includes a sample-independent component (Qr_sample_independent_conversion) and a sample-dependent component (Qr_sample_dependent_conversion). The sample-dependent component is sample dependent because the charge drawn from the reference voltage source depends on which of the converter stages 200-$m$ are switched to the 0 state and which of the converter stages are switched to the 1 state during the conversion process. When DAC 110 is reset during the reset process, the converter stages of DAC 110 are sequentially reset by switching the two of the capacitors of the converter stage that were switched from ground to reference voltage $V_R$ or from reference voltage $V_R$ to ground during the conversion process back to ground or back to reference voltage $V_R$, respectively, to restore the state of the converter stage to the reset state. While the capacitors of the converter stage are switched back to their original states, the switching states of the capacitors of the remaining converter stages remain unchanged.

During the reset process, the charge (Qr_reset) drawn from the reference voltage source also has a sample-independent component (Qr_sample_independent_reset) and a sample-dependent component (Qr_sample_dependent_reset). Both Qr_conversion and Qr_reset are positive. Qr_sample_dependent_conversion and Qr_sample_dependent_reset can be either positive or negative. In the example of ADC 100 shown in FIG. 2, in which the converter stages 200-m of DAC 110 are reset sequentially with a temporal offset between them equivalent to a multiple of the reset time constant of the converter stages, sample-dependent charge Qr_sample_dependent-_reset drawn from reference voltage source 112 during the reset process is substantially equal in absolute value, but is opposite in sign, to sample-dependent charge Qr_sample_dependent_conversion drawn from the reference voltage source during the conversion process. Consequently, sum of the sample-dependent charge during the conversion process and the sample-dependent charge during the reset process is substantially zero and is therefore sample-independent. In a conventional ADC in which the converter stages are reset simultaneously, sample-dependent charge Qr_sample_dependent_reset drawn from reference voltage source 112 during the reset process differs in absolute value, and possibly in sign, from sample-dependent charge Qr_sample_dependent_conversion drawn from the reference voltage source during the conversion process. Consequently, the total charge drawn by a conventional ADC during the conversion cycle exhibits the sample dependency illustrated in FIG. 1.

In other examples of ADC 100 in which the converter stages 200-m of the DAC 110 are reset with a temporal offset between at least two of them, e.g., examples in which the converter stages 200-m of DAC 110 are reset sequentially with a temporal offset between them equivalent to less than the reset time constant of the converter stages, or examples in which the converter stages are reset with temporal offsets between fewer than all of them, sample-dependent charge Qr_sample_dependent_reset drawn from reference voltage source 112 during the reset process only approximates in absolute value, but is opposite in sign, to the sample-dependent charge Qr_sample_dependent_conversion drawn from the reference voltage source during the conversion process. In such examples, the sum of the sample-dependent charge Qr_sample_dependent_conversion during the conversion process and the sample-dependent charge Qr_sample_dependent_reset during the reset process can differ from substantially zero. Consequently, the sum has some sample dependence, but the sample dependence is usefully less than that of a conventional ADC in which all of the stages of the DAC are reset simultaneously.

In the above-described example, the reset circuit 160 of ADC 100 resets converter stages 200-1 through 200-M sequentially, starting with most-significant-bit converter stage 200-1 and ending with least-significant bit converter stage 200-M. However, in examples of ADC 100 in which reset circuit 160 resets the stages sequentially, the order in which the stages are reset is unimportant. A reset circuit that resets the converter stages in the reverse of the order described, or some other order, can be used as reset circuit 160.

As noted above, the transistors that implement the switches 230, 232, 234, 236 of each converter stage 200-m are sized such that their ON resistances that are scaled inversely to the capacitance of the capacitors 220, 222, 224, 226 in the stage, so that all the converter stages 200-m have substantially the same reset time constant. Moreover, the reset time constant is relatively short compared with the operating cycle time of each of the converter stages, a time that will be referred to as a stage cycle time. In an example, the delay elements 162-m of reset circuit 160 are configured to provide a delay equivalent to 1/M of the stage cycle time. This enables the stages to be reset sequentially by increasing the portion of the conversion cycle allocated to the reset process by a time equivalent to one stage cycle time. In an example, the delay provided by delay elements 162-m is equivalent to 3-4 times the reset time constant of the converter stages.

A reset circuit 160 having delay elements 162-m as just described performs a sequential reset that increases the duration of each conversion cycle performed by ADC 100 by the equivalent of one stage cycle time compared to a conventional ADC having a simultaneous reset. The conversion cycle of an exemplary 10-bit embodiment of ADC 100 would have a duration equivalent to 13 stage cycle times instead of the 12 stage cycle times of the conventional ADC. The sampling process takes 1 stage cycle time, the conversion process in which the 10 bits of digital value DV are generated takes 10 stage cycle times, and the sequential reset process takes 2 stage cycle times instead of the 1 stage cycle time of the conventional ADC. The sequential reset process thus increases the duration of the conversion cycle of ADC 100 by about 8%, compared with the conventional ADC.

In some applications, it may be desirable to reduce the overhead imposed by the above-describe sequential reset process. Since the reset characteristics of the conversion stages are substantially exponential, the largest current flow from reference voltage source 112 occurs at the beginning of the reset process performed on each converter stage 200-m. Accordingly, a beneficial reduction in the sample dependence of the reference voltage can be obtained even when the delay provided by each of the delay elements 162-m is substantially reduced compared to the delay of 3-4 reset time constants exemplified above. In another example, the delay provided by each delay element 162-m of reset circuit 160 is the equivalent of one reset time constant of converter stages 200-m. In yet another example, the delay provided by each delay element 162-m of reset circuit 160 is the equivalent of one-fourth of the reset time constant of converter stages 200-m. In yet another example, the delay provided by each delay element 162-m of reset circuit 160 is the equivalent of as little as 1/10 of the reset time constant of converter stages 200-m. The reduced delay times still usefully reduce the sample-dependence of the reference voltage. The temporal offsets resulting from even the very short delays disclosed herein are substantially larger than any intrinsic temporal offset that occurs in a conventional ADC as a result of the reset pulse propagating along a printed-circuit trace and/or integrated circuit metallization layer.

Another approach to reducing the overhead imposed by sequentially resetting DAC 110 is to reset the DAC with a temporal offset between only most-significant-bit converter stage 200-1 and remaining converter stages 200-2 through 200-M. In such an embodiment, reset circuit 160 has only a single delay element 162-2. The input 166-2 of the delay element is connected to reset input 164 of reset circuit 160 to receive reset pulse R from controller 180. Reset input 164 is additionally connected to the reset input 159-1 of the stage controller 151-1 of SAR logic 150. The output 168-2 of delay element 162-2 is connected to the reset inputs 159-2 through 159-M of stage controllers 151-2 through 151-M of the SAR logic, so that delayed reset pulse R-2 simultaneously resets stages 200-2 through 200-M of DAC 110, but temporally offset from the reset of converter stage 200-1.

In another example, the more-significant-bit converter stages 200-1, 200-2 . . . of DAC 110 are reset sequentially, and the remaining less-significant bit converter stages . . . 200-M are reset simultaneously. In such an example, reset circuit 160 has fewer than M-1 delay elements 162-m connected in series. All but the last of the delay elements, e.g., delay elements 162-2, 162-3, provide an individual reset pulse for a respective stage controller, e.g., 151-2, 151-3 of SAR logic 150, and the last of the delay elements provides a common reset pulse that resets the remaining stage controllers of the SAR logic simultaneously, but temporally offset from the more-significant-bit converter stages.

In embodiments in which the above-described measures are taken to reduce the overhead imposed by sequentially resetting DAC 110 with reset times exceeding the reset time constant of the stages, the charge drawn from reference voltage source 112 during each conversion cycle is not completely independent of the sample of the analog input signal, as noted above. However, the sample dependence can be sufficiently small that these techniques will give results acceptable for many practical applications.

FIG. 7 is a flow chart showing an example 400 of an analog-to-digital conversion method. In block 410, a source of a reference voltage is provided. In block 420, a digital-to-analog converter comprising converter stages is provided. The converter stages range in significance from most significant to least significant. Each of the converter stages includes capacitors and switches. The capacitors in the converter stages are weighted in capacitance in accordance with the significance of the converter stage. In block 430, the switches are controlled during a conversion process to selectively connect the capacitors to the reference voltage or to ground. In block 440, the switches are controlled during a reset process to reset the converter stages with a temporal offset between at least two of the converter stages.

In an embodiment, method 400 additionally includes sampling an analog signal to generate an analog sample, inputting the analog sample to preset the digital-to-analog converter, and subjecting the sample to comparison generate a comparison signal. Controlling the switches during the conversion process includes sequentially enabling the converter stages, and controlling the switches in each converter stage as the converter stage is enabled in response to the comparison signal.

This disclosure describes the invention in detail using illustrative embodiments. However, the invention defined by the appended claims is not limited to the precise embodiments described.

I claim:

1. A charge redistribution SAR analog-to-digital converter, comprising:
    a source of a reference voltage;
    a digital-to-analog converter, comprising converter stages ranging in significance from most significant to least significant, each converter stage comprising capacitors and switches, the switches controllable to selectively connect the capacitors to the reference voltage or to ground, the capacitors of the converter stages weighted in capacitance in accordance with the significance of the converter stage; and
    a reset circuit to control the switches to reset the converter stages with a temporal offset between at least two of the converter stages.

2. The analog-to-digital converter of claim 1, in which:
    the converter stages have a reset time constant; and
    the temporal offset is greater than one-tenth of the reset time constant.

3. The analog-to-digital converter of claim 2, in which the temporal offset is greater than one fourth of the reset time constant.

4. The analog-to-digital converter of claim 2, in which the temporal offset is greater than the reset time constant.

5. The analog-to-digital converter of claim 1, in which the temporal offset is between the most-significant converter stage and the next-most-significant converter stages.

6. The analog-to-digital converter of claim 1, in which the temporal offset is between the most-significant converter stage and the remaining converter stages.

7. The analog-to-digital converter of claim 1, in which the temporal offset between each converter stage and the respective next converter stage increases with the significance of the converter stage.

8. The analog-to-digital converter of claim 1, in which:
    the analog-to-digital converter additionally comprises:
        an analog signal input,
        a comparator to generate a comparator output signal,
        a sampling switch between the analog signal input and the comparator, and
        a node between the sampling switch and the comparator;
    the digital-to-analog converter additionally comprises an input/output port connected to the node, and
    in the converter stages, each of the capacitors is connected between the input/output port and a common terminal of a respective one of the switches, a first terminal and a second terminal of the one of the switches are connected to ground and the reference voltage, respectively, and a control input of the one of the switches is connected to receive a switch control signal that depends on the comparator output signal.

9. The analog-to-digital converter of claim 1, in which each of the converter stages is to output a respective bit of a digital value representing a sample of an analog input signal.

10. A charge redistribution SAR analog-to-digital conversion method, comprising:
    providing a source of a reference voltage;
    providing a digital-to-analog converter comprising converter stages ranging in significance from most significant to least significant, each converter stage comprising capacitors and switches, the capacitors in the converter stages weighted in capacitance in accordance with the significance of the converter stage;
    controlling the switches during a conversion process to selectively connect the capacitors to the reference voltage or to ground, and
    controlling the switches during a reset process to reset the converter stages with a temporal offset between at least two of the converter stages.

11. The analog-to-digital converter of claim 10, in which:
    the converter stages have a reset time constant; and
    in the controlling the switches to reset the converter stages, the temporal offset is greater than one-tenth of the reset time constant.

12. The analog-to-digital conversion method of claim 11, in which, in the controlling the switches during the reset process, the temporal offset is greater than one fourth of the reset time constant.

13. The analog-to-digital conversion method of claim 11, in which, in the controlling the switches during the reset process, the temporal offset is greater than the reset time constant.

14. The analog-to-digital conversion method of claim 10, in which, in the controlling the switches during the reset process, the temporal offset is between the most-significant converter stage and the next-most-significant converter stages.

15. The analog-to-digital conversion method of claim 10, in which, in the controlling the switches during the reset process, the temporal offset is between the most-significant converter stage and the remaining ones of the converter stages, collectively.

16. The analog-to-digital conversion method of claim 10, in which, in the controlling the switches during the reset process, the reset circuit is to reset the converter stages with a temporal offset between each converter stage and the respective next converter stage.

17. The analog-to-digital conversion method of claim 10, in which:
    the method additionally comprises:
        sampling an analog signal to generate an analog sample,
        inputting the analog sample to preset the digital-to-analog converter, and
        subjecting the sample to comparison generate a comparison signal; and
    the controlling the switches during the conversion process comprises:
    sequentially enabling the converter stages, and
    controlling the switches in each converter stage as the converter stage is enabled in response to the comparison signal.

18. The analog-to-digital conversion method of claim 17, additionally comprising outputting a respective bit of a digital value representing the analog sample from each of the converter stages.

19. A charge redistribution SAR analog-to-digital converter, comprising:
    a source of a reference voltage;
    a digital-to-analog converter, comprising converter stages ranging in significance from most significant to least significant, each converter stage comprising capacitors and switches, the switches controllable to selectively connect the capacitors to the reference voltage or to ground, the capacitors of the converter stages weighted in capacitance in accordance with the significance of the converter stage; and
    a reset circuit to control the switches to sequentially reset the converter stages with a temporal offset between each of the converter stages and a respective next-more-significant one of the converter stages.

20. The analog-to-digital converter of claim 19, in which:
    the analog-to-digital converter additionally comprises:
        an analog signal input,
        a comparator to generate a comparator output signal,
        a sampling switch between the analog signal input and the comparator, and
        a node between the sampling switch and the comparator;
    the digital-to-analog converter additionally comprises an input/output port connected to the node, and
    in the converter stages, each of the capacitors is connected between the input/output port and a common terminal of a respective one of the switches, a first terminal and a second terminal of the one of the switches are connected to ground and the reference voltage, respectively, and a control input of the one of the switches is connected to receive a switch control signal that depends on the comparator output signal.

\* \* \* \* \*